(12) United States Patent
Green et al.

(10) Patent No.: US 6,929,724 B2
(45) Date of Patent: Aug. 16, 2005

(54) SHUTTER

(75) Inventors: Gordon Robert Green, Bristol (GB); Robert Kenneth Trowell, Bristol (GB)

(73) Assignee: Trikon Technologies Limited, Newport (GB)

( * ) Notice: Subject to any disclaimer, the term of this patent is extended or adjusted under 35 U.S.C. 154(b) by 166 days.

(21) Appl. No.: 10/434,190

(22) Filed: May 9, 2003

(65) Prior Publication Data

US 2003/0209199 A1 Nov. 13, 2003

(30) Foreign Application Priority Data

May 9, 2002 (GB) .............................................. 0210660

(51) Int. Cl.[7] .............................................. C23C 14/00
(52) U.S. Cl. .................... 204/298.11; 118/720; 118/504
(58) Field of Search ...................... 204/298.11; 118/720, 118/721, 500, 504

(56) References Cited

U.S. PATENT DOCUMENTS

| 4,702,506 A | 10/1987 | Iimura ...................... 292/251.5 |
| 5,413,688 A | 5/1995 | Crowley ................ 204/298.11 |

FOREIGN PATENT DOCUMENTS

| GB | 1480564 | 9/1975 |
| GB | 2 060 761 A | 5/1981 |
| GB | 2 075 109 A | 11/1981 |
| JP | 59-139616 | 8/1984 |
| JP | 61-248544 | 11/1986 |
| JP | 63-161166 | 7/1988 |
| JP | 2-38562 | 2/1990 |
| JP | 4-99865 | 3/1992 |
| JP | 4-193948 | 7/1992 |
| JP | 5-70947 | 3/1993 |
| JP | 6-172992 | 6/1994 |
| JP | 63-213668 | 9/1998 |
| JP | 2001-131739 | 5/2001 |
| JP | 2002-118063 | 4/2002 |

*Primary Examiner*—Rodney G. McDonald
(74) *Attorney, Agent, or Firm*—Volentine Francos & Whitt, PLLC

(57) ABSTRACT

This invention relates to a shutter for use in physical vapour deposition apparatus having a chamber. The shutter, generally indicated at 5, is located in a side housing 6 of the vacuum chamber 7, whilst sputtering is taking place. Once the substrate 2 is treated, the substrate is removed from the chamber and the shutter is brought in to an operative position above a wafer pedestal or support 1. The shutter is mounted on an arm 8 using a fixing boss 10, the arm and the boss being magnetically coupled.

9 Claims, 3 Drawing Sheets

SHUTTER

CROSS-REFERENCE TO RELATED APPLICATION

A claim to priority is made to British Patent Application No. 0210660.7 filed 9$^{th}$ May 2002, the contents of this application being incorporated herein by in their entireties.

BACKGROUND OF THE INVENTION

1. Field of Invention

This invention relates to a shutter for use in a physical vapour deposition apparatus having a chamber.

2. Description of Related Art

It is well known in physical vapour deposition chambers, such as sputter deposition chambers, to line the walls with shielding to capture any unwanted deposition. The shielding is generally retained in place by a combination of physical fit and gravity and, since most shielding is not required to move during the process, this works perfectly well.

For a number of processes, for instance reactive sputter deposition, there is a shielding component, called the process shutter, which must be able to move. The process shutter is provided to cover the substrate support pedestal for example during the target clean-up process, which is carried out between successive substrate deposition processes. During the actual deposition process, the shutter must be located in some part of the chamber, where it will not compromise the uniformity of deposition of the substrate. In some chambers the shutter is translated in a horizontal plane (by rotary or linear action) so that it lies within an adjacent pocket or housing. In others, it is rotated into a space beneath or beside the support pedestal.

Because, during use, the shutter receives deposition, it must (in whole or in part) be easily removable, so that it may be replaced at appropriate intervals by a clean component. Another design constraint is that the shutter movement must be as rapid as possible and this generally requires that the shutter be rigidly attached to its actuating mechanism. Commonly this is achieved by bolting the two parts together.

Since, for most chambers, maintenance access is generally from above, by means of removal of the target, it is convenient if the fixing screws are located in the upper surface of the shutter. However, in this position, they generally receive a significant amount of deposited material and can be extremely difficult or impossible to remove subsequently. In addition, the sharp features associated with the screw head may cause local delamination of the deposited film, resulting in particulate contamination of the substrates processed within the chamber.

In order to overcome these limitations, fixing screws are commonly located in positions away from the primary deposition flux. However, this immediately makes the removal of the screws more difficult, because maintenance access is much less straight forward.

SUMMARY OF THE INVENTION

The present invention consists in a shutter for use in a deposition apparatus having a chamber, the shutter including a shutter blade and a support for supporting the shutter blade during movement between an operative position and an inoperative position characterised in that the shutter blade is secured to the support magnetically.

Preferably a part of a non-magnetic blade is sandwiched between a boss and a support that are magnetically attracted one to the other and the boss may have a peripheral portion which shadows any interface between the boss and the shutter blade to prevent deposited material adhering the boss and the shutter blade together. For example, the peripheral portion may be a flange which extends above and is spaced from the shutter blade, for example in the form of an overhang. The boss is preferably ferromagnetic and the support carries one or more magnets.

Although the invention has been defined above it is to be understood it includes any inventive combination of the features set out above or in the following description.

BRIEF DESCRIPTION OF THE DRAWINGS

The invention may be performed in various ways and a specific embodiment will now be described by way of example, with reference to the accompanying drawing in which:

In FIG. 1, a substrate support pedestal 1, which is located within a vacuum chamber 7, supports a substrate 2, which receives deposition material 3 from the target assembly 4 utilizing a known sputtering process. A shutter, generally indicated at 5, is located in a side housing 6 during the sputtering process.

Figure 2:
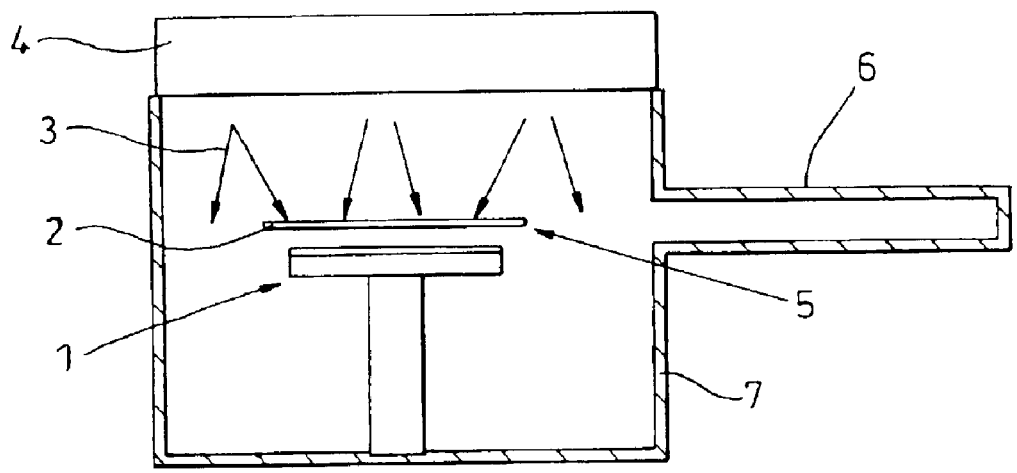
FIG. 2 is a similar view with the shutter in its operative position.

Once the substrate 2 is treated, it is removed from the chamber and the shutter 5 is brought into its operative position above the pedestal as shown in FIG. 2. The surface of the target is duly sputtered to clean it ready for the next substrate 2 which is introduced onto the pedestal 1, whilst the pedestal is protected from deposition material 3 by the shutter 5.

Figure 1:
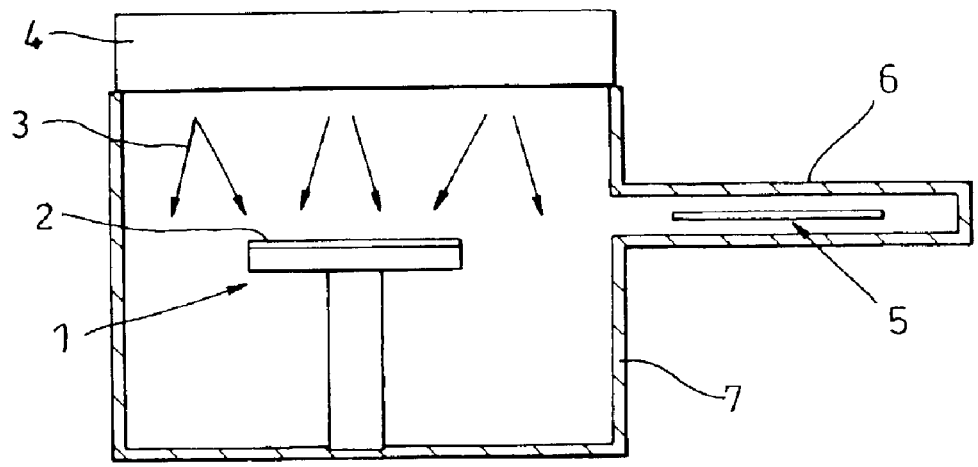
FIG. 1 is a schematic representation of a sputter aparatus with the shutter in its inoperative position.

As illustrated in FIGS. 1 and 2, the system is well known in the art.

Figure 3:
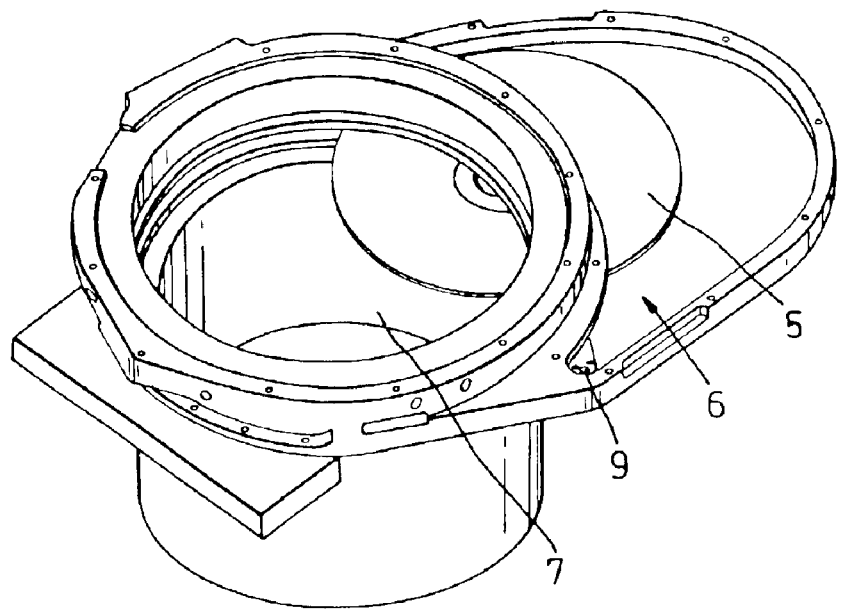
FIG. 3 is a schematic perspective representation from one side and above of a chamber, with the target and shutter blade housing removed to show the shutter blade between its operative and inoperative positions.
Figure 4:
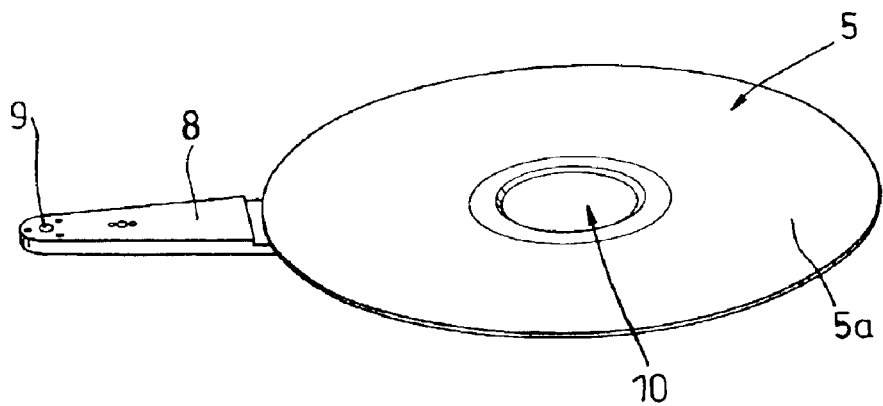
FIG. 4 is a schematic view from one side and above of the shutter blade of the preferred embodiment.

FIG. 3 is a more realistic representation of the chamber 7 and housing 6 and illustrates a specific form of the shutter, which is generally indicated at 5. As will be seen in FIG. 4, the shutter 5 includes an arm 8, which can be pivoted about an axis passing through 9, a shutter blade 5a and a fixing boss 10.

Figure 5:
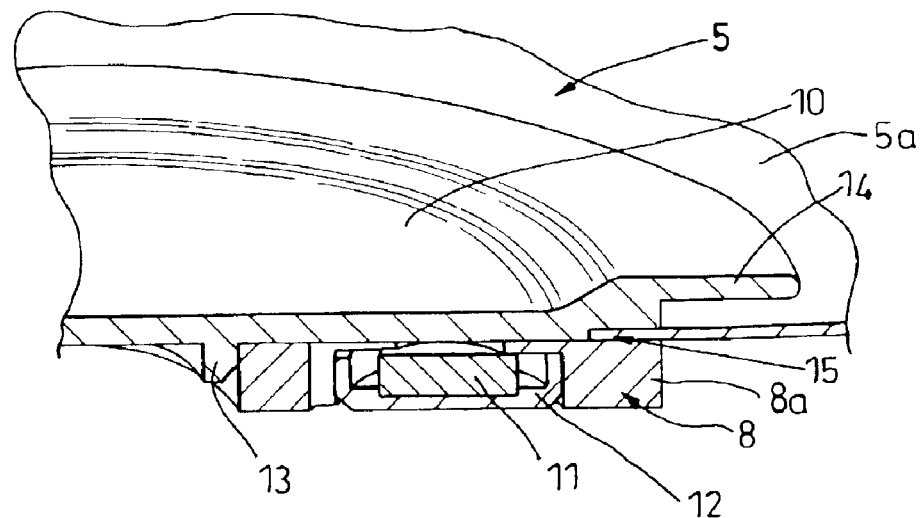
FIG. 5 is a schematic enlarged cross-sectional view of the boss area of the shutter.
Figure 6:
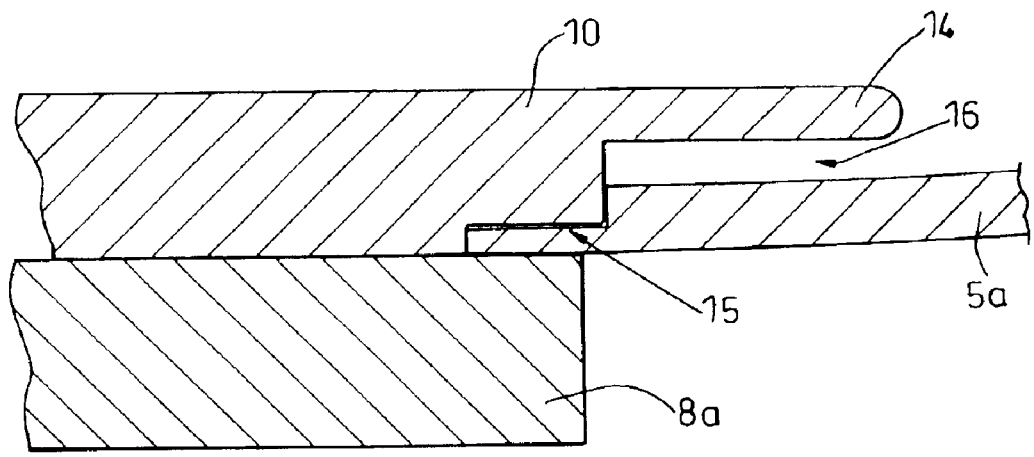
FIG. 6 is a cross-sectional view showing the nature of the boss overhang.

FIG. 5 shows an enlarged cross-sectional view adjacent the location of the fixing boss 10. It will first be noticed that the blade 5a and the boss 10 are co-operatively engaged at 15 so that the blade 5a is trapped between the boss 10 and the annular end 8a of the arm 8. The boss 10 also has a location spigot 13, which locates in the opening 8b of the annular end 8a. The boss has a peripheral extension 14 which is spaced above the blade 5a to form an overhang so as to prevent a continuous surface of deposited material building up over the boss 10 and the blade 5a, which would, as with the screw heads, effectively "weld" the two components together. The portion 14 and the blade 5a hence define a space 16 into which a screw driver can be inserted to help lever the boss 10 free, when replacement of the blade 5a, with a clean blade is required.

Although there will be some frictional engagement between the boss 10 and the blade 5a and the boss 10 and the support arm 8, the principal means of retaining the boss 10 on the support arm 8, and hence retaining the blade 5a on the support arm 8, is magnetic. Any suitable magnetic scheme could be utilized, but that illustrated has the boss 10 been formed of ferromagnetic material (preferably ferromagnetic stainless steel) and suitably located magnets 11 (NdFeB is preferred) disposed in the annular end 8a. The magnetic field of the magnets 11 can be concentrated by a flux return cup 12, which will be of ferromagnetic material.

Other arrangements would include a ferromagnetic shutter with no fixing boss or the boss having one or more magnets oppositely sensed to those in the arm and in principle electromagnets could also be used.

It is desirable that any magnetic effect is localised hence the preferred use of a fixing boss where there is a target magnetron assembly or other magnetic fields provided for the processing of the substrate. The use of a ferromagnetic boss and a non-ferromagnetic shutter thereby minimises the possibility of magnetic peturbment.

The benefits of this arrangment are principally related to tool productivity. The shutter blade 5a can be exchanged rapidly and simply, from within the process chamber. There is no requirement to access the shutter housing. There are no screws, which may take time to fix, maybe dropped or lost, or may be welded to the blade. Also the reduced time for which the chamber is opened is significant, because the time for the vacuum to recover after maintenance is strongly tied to the time for which the chamber was open to atmosphere. Thus five minutes saved on chamber maintenance time can result in thirty minutes saved on the time to recover to base pressure in high vacuum systems such as PVD process chambers. Thus surprisingly, although there are significant productivity advantages in having a rapid and simple method and arrangement for changing the shutter blade 5a, no-one skilled in the art has previously proposed the use of magnetic engagement.

The use of the arrangement has been described in connection with physical vapour deposition processes. However, they are applicable to any desposition process in which a portion of the chamber or the chamber furniture has to be intermittently shielded.

What is claimed is:

1. A shutter for use in a deposition apparatus having a chamber, the shutter including a shutter blade, a movable support arm for supporting the shutter blade and for moving the shutter blade between an operative position and an inoperative position, characterised in that the shutter blade is secured to the movable support arm magnetically.

2. A shutter as claimed in claim 1 wherein the shutter blade is non-magnetic and is secured to the movable support arm by a ferromagnetic boss and the movable support arm carries one or more magnets.

3. A shutter as claimed in claim 2 wherein a part of the blade is sandwiched between the boss and the movable support arm.

4. A shutter as claimed in claim 2 wherein the boss includes a peripheral portion which shadows any interface between the boss and the shutter blade to prevent deposited material adhering to the boss and the shutter blade together.

5. A shutter as claimed in claim 4 wherein the peripheral portion is a flange which extends above and is spaced from the shutter blade.

6. A shutter for use in a deposition apparatus having a chamber, the shutter including a shutter blade, a support for supporting the shutter blade during movement between an operative position and an inoperative position characterized in that the shutter blade is secured to the support magnetically, wherein the shutter blade is non-magnetic and is secured by a ferromagnetic boss and the support carries one or more magnets.

7. A shutter as claimed in claim 6 wherein a part of the blade is sandwiched between the boss and the support.

8. A shutter as claimed in claim 6 wherein the boss includes a peripheral portion which shadows any interface between the boss and the shutter blade to prevent deposited material adhering to the boss and the shutter blade together.

9. A shutter as claimed in claim 8 wherein the peripheral portion is a flange which extends above and is spaced from the shutter blade.

* * * * *